United States Patent [19]
Kobayashi et al.

[11] Patent Number: 5,675,274
[45] Date of Patent: Oct. 7, 1997

[54] SEMICONDUCTOR CLOCK SIGNAL GENERATION CIRCUIT

[75] Inventors: Tomohiro Kobayashi; Yukihiro Fujimoto, both of Kanagawa-ken, Japan

[73] Assignee: Kabushiki Kaisha Toshiba, Japan

[21] Appl. No.: 570,970

[22] Filed: Dec. 12, 1995

[30] Foreign Application Priority Data

Dec. 13, 1994 [JP] Japan ................................. 6-308769

[51] Int. Cl.[6] .................................................. H03L 7/06
[52] U.S. Cl. ................................................. 327/158; 327/291
[58] Field of Search ................................. 327/99, 150, 141, 327/156, 144, 158, 145, 291, 146, 292, 147, 298, 148, 149

Primary Examiner—Timothy P. Callahan
Assistant Examiner—Jeffrey Zweizig
Attorney, Agent, or Firm—Banner & Witcoff, Ltd.

[57] ABSTRACT

A clock signal generating circuit is capable of testing a delay line loop (DLL) circuit by a method wherein, when an LSI circuit operates at a lower speed for a burn-in test, etc., the DLL circuit performs the same operation as when the LSI circuit operates normally at a high speed. This invention includes a selector for selecting either a reference clock signal or a test clock signal having a different phase with respect to the reference clock signal, and a delay line loop system phase-locked loop circuit for giving a delay to an output signal of the selector so as to get rid of a phase difference between the reference clock signal and an internal clock signal that has been propagated through a circuit to be supplied with a clock, and for generating the clock signal to be supplied to the circuit.

9 Claims, 14 Drawing Sheets

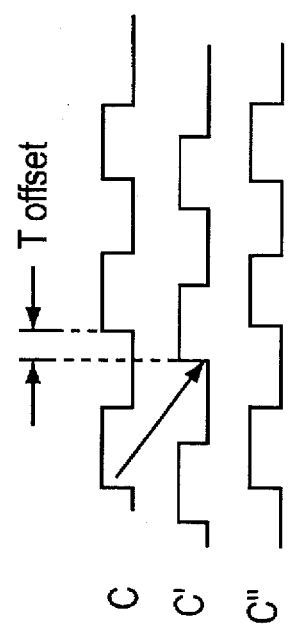
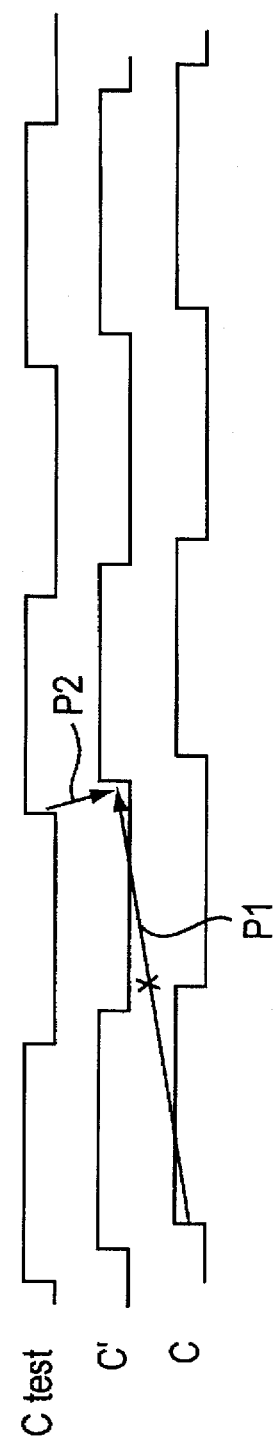
FIG. 5(a)
FIG. 5(b)

SEMICONDUCTOR CLOCK SIGNAL GENERATION CIRCUIT

BACKGROUND OF THE INVENTION

1. Field of the Invention

The present invention relates to a clock signal generating circuit based on a delay line loop phase-locked loop circuit, and in particular, to a semiconductor device in which such clock signal generating circuit is included.

2. Description of Related Art

In general, in a device such as a microprocessor, a large-scale integrated circuit (LSI), or the like, users often require each device to operate at high frequency. Further, as a system is formed by incorporating a plurality of such devices into the system, each device is needed to operate in synchronism with a system clock or a clock supplied from an external unit.

Such fast-operating LSI devices lessen a delay that may be tolerated in a clock signal generated in an internal circuit with respect to a reference clock signal supplied from an external unit. Further, in order to synchronize with a clock signal of another LSI circuit, the present LSI circuit controls its internal clock signal by means of a clock signal generating circuit using a Phase-Locked Loop (PLL) circuit. This PLL circuit makes use of a Delay Line Loop (DLL) system that uses a delay line circuit in an oscillator to delay a reference clock signal by one cycle to synchronize with a rising edge of a following clock signal.

FIG. 10 is a block diagram showing a conventional clock signal generating circuit using a delay line loop phase-locked loop circuit (hereinafter, referred to as a DLL circuit).

This clock signal generating circuit is composed of a DLL circuit 100. The DLL circuit 100 includes a phase comparator 101 for detecting a phase difference between a reference clock signal C derived from an external unit and an internal clock signal C" by way of an LSI internal circuit 110; a loop filter 102 for changing an output voltage according to a phase difference output of the phase comparator 101; and a delay line circuit 103 for changing a delay with respect to the reference clock signal C according to an output voltage of the loop filter 102. Then, a delayed clock signal C' output from the DLL circuit 100 is transmitted through the LSI internal circuit 110 as internal clock signal C" to the phase comparator 101, which compares the internal clock signal C" with the reference clock signal C.

In the DLL circuit 100, the internal clock signal C" is used as an input clock to the phase comparator 101 since it is a fully delayed clock. If the delayed internal clock signal C' is directly input to the phase comparator 101, the output of the phase comparator 101 is not delayed enough. Consequently, the output of the DLL circuit 100 does not become an advanced ahead phase clock signal. Therefore, the phase comparator 101 uses the internal clock signal C".

In the above clock signal generating circuit, the delayed clock signal C' is generated as a signal delayed with respect to the reference clock signal C by means of the delay line circuit 103. The phase comparator 101 detects a phase difference between rising edges of the internal clock signal C" and the reference clock signal C, and the loop filter 102 increases or decreases an output electric potential according to this phase difference. The delay line circuit 103 changes a delay time in a direction of offsetting the phase difference by the output electric potential of this loop filter 102.

Such operations are repeatedly performed. If the delay line circuit 103 delays the internal clock signal C" by exactly one cycle more than the reference clock signal C, the phase comparator 101 will not detect a phase difference between the current clock and the following clock (phase-locked state). The loop filter 102 holds the value of the output voltage and the DLL circuit 100 still continues to generate the internal clock signal C", a phase of which is synchronized with the reference clock signal C.

At this time, a condition may occur where a phase of the internal clock signal C" advances slightly ahead of the reference clock signal C. The LSI circuit may be designed such that the reference clock signal C is supplied to register 111 located close to the reference clock signal C within the LSI circuit, and the delayed clock signal C', a phase of which advances ahead of the reference clock signal C is supplied to another register 112 located far from the reference clock signal C. On the other hand, if the reference clock signal C is supplied to a register located far from the reference clock signal C, a clock skew occurs. By use of this conventional DLL circuit to generate internal clock signal C", the clock skew can be lessened.

The register 111 is shown at 600 in FIG. 15. Element 600 corresponds to elements 4 and 5 (FIG. 1), 54, 55, 64 and 65 (FIG. 8), 111 and 112 (FIG. 10), 211, 212, 261 and 262 (FIG. 12) and 400 (FIG. 14). Address input signal and delayed clock signal C' are input to this circuit. There are some P channel transistors 161, N channel transistors 162 and buffers 163. When the register 111 is physically located far away from the DLL circuit 100, the phase of the delayed clock signal C' is more delayed by the long distance than is the case when the register 111 is physically located near from the DLL circuit 100. On the other hand, the address signal is provided to each register 111 at almost the same time, because there are many address signal input terminals in the semiconductor chip. Therefore, the distance between the address signal input terminal and the register 111 is very closely comparable to the distance between the DLL circuit 100 and the register 111.

If the same phase clock signal as is being input to the closest register 111 is also input the farthest located register, the time when the address signal is input corresponds to the time when the clock signal is input at the farthest register 111. Therefore, the problem of inconsistent timing between clock signal and address signal is prevented at the farthest register 111.

As described above, in using the DLL circuit 100, it is advantageous that the delayed clock signal C' used for the LSI internal circuit 110 be synchronized with the reference clock signal C supplied from an external unit (i.e., without any phase differences). A delay in the internal circuit 110 due to buffering of LSI clock distribution portions does not generate a synchronized state.

FIG. 16 shows at 700 one simplified example of the LSI internal circuit 110. Element 700 corresponds to elements 3 (FIG. 1), 53 and 63 (FIG. 8), 110 (FIG. 10), 210 and 260 (FIG. 12) and 500 (FIG. 14). The delayed clock signal C' is supplied to this circuit 110. The internal clock signal C" is output from this circuit. In this circuit 110, there are several clock buffers 151, wiring parasitic capacitors 152 and wiring parasitic resistors 153. Thus signal C" is delayed with respect to signal C'.

The above clock signal generating circuit also has a limited lockable frequency range since the DLL circuit 100 has a limited time delay range. The lockable minimum frequency and maximum frequency of the DLL circuit 100 are respectively decided by the maximum delay time and minimum delay time of the delay line circuit 103.

The DLL circuit 100 is optimized for a normal-active high-speed operation (for example, 20 MHz to 200 MHz). When the LSI circuit performs a normal operation, a delay from the delay line circuit 103 necessary for DLL circuit 100 to operate normally does not exceed a delay amount that can be generated in the delay line circuit 103. As shown by an arrow in FIG. 11(a), the DLL circuit 100 can operate normally. However, when the LSI circuit operates at a low speed, for example, in the case where a burn-in test for an LSI circuit evaluation is performed (e.g., as when high-speed evaluator equipment is not available), the LSI circuit must be tested at a lower clock frequency (for example, 1 MHz). Since a delay necessary for low speed operation of the delay line circuit 103 exceeds a delay amount that can be generated in delay line circuit 103, as shown by an arrow in FIG. 11(b), the DLL circuit 100 will not operate normally.

FIG. 12 is a diagram showing an embodiment to which the conventional clock signal generating circuit is applied in a two-phase clock system semiconductor device.

The two-phase clock system semiconductor device of this embodiment satisfies a specification of a tack time (clock to data output access time) in a synchronous Random-Access Memory (RAM). In this specification, the tack time means the necessary time between the liming of a clock signal coming into a buffer and the timing of the data signal output from the buffer. Therefore, this embodiment uses two phases of a reference clock K (for the input side of semiconductor device 200) and a reference clock C (for the output side of semiconductor device 200) of which a phase is advanced ahead of the reference clock K, as a reference "clock", as shown in FIG. 13(a).

There are provided two clock signal generating circuits within a semiconductor device 200 and the clock signal generating circuits have the same function as the circuit shown in FIG. 10 as described above. A first reference clock C is supplied from an external unit to the one clock signal generating circuit and a second reference clock K is supplied to the other clock signal generating circuit.

The DLL circuit of the clock signal generating circuit supplied with the first reference clock C includes a phase comparator 201; a loop filter 202; and a delay line circuit 203. The DLL circuit of the clock signal generating circuit supplied with the second reference clock K includes a phase comparator 251; a loop filter 252; and a delay line circuit 253. Then, delayed clocks C', K' of which phases are advanced ahead of the first and second reference clocks C, K, are generated, respectively. The delayed clock C' is supplied to an internal circuit 210 and the delayed clock K' is supplied to an internal circuit 260. The operations thereof are performed in the same manner as a single-phase clock as shown in FIG. 10 as described above.

Furthermore, an output register 211 and an input register 261 correspond to the register 111 as shown in FIG. 10 as described above, and similarly, an output register 212 and an input register 262 correspond to the register 112 as shown in FIG. 10.

Even in such two-phase clock system, when the LSI circuit operates at a low speed, there occurs the same problem as the single-phase clock. Namely, unlike the time when the LSI circuit operates normally as shown in FIG. 13(a), when the LSI circuit operates at a low speed, a delay necessary for a delay line circuit exceeds a delay amount that can be generated in the delay line circuit as shown by an arrow in FIG. 13(b), and the clock signal generating circuit cannot operate normally.

As a resolution of such problems, the clock signal generating circuit as shown in FIG. 14 has been proposed.

FIG. 14 is a block diagram showing another conventional clock signal generating circuit with employment of the DLL circuit.

This clock signal generating circuit includes a DLL circuit 300 corresponding to the DLL circuit as shown in FIG. 10; and a selector 400. The DLL circuit 300 includes a phase comparator 301; a loop filter 302; and a delay line circuit 303. The phase comparator 301, the loop filter 302, and the delay line circuit 303 correspond to the phase comparator 101, the loop filter 102, and the delay line circuit 103 as shown in FIG. 10, respectively. An internal circuit 500 corresponds to the internal circuit 110 as shown in FIG. 10.

The selector 400 is used as a supply source of the delayed clock signal C' to select either an output of the DLL circuit 300 or the reference clock signal C by a clock selection signal SE supplied form an external unit. Thus, one of the output of the DLL circuit 300 and the reference clock signal C supplied from the external unit is selectively applied to the internal circuit 500.

When the LSI circuit operates at a low speed and is tested, the selector 400 selects the reference clock signal C as the delayed clock signal C' by the clock selection signal SE. At this time, since the LSI circuit operates at a low speed, a delay of the internal clock signal C' does not influence the operation of the LSI internal circuit 500, and it does not become necessary to use the DLL circuit and generate the delayed clock signal C', a phase of which is advanced ahead of the reference clock signal.

Notwithstanding the above description, the conventional clock signal generating circuit shown in FIG. 14 as described above does not operate the DLL circuit 300 when the LSI circuit is evaluated. Therefore, there are some problems that may occur in the DLL circuit 300 that are not tested in an evaluation of the LSI circuit. For example, the DLL circuit 300 is not subjected to stress in the above-mentioned burn-in test, and as a result, the entire LSI circuit cannot sufficiently be evaluated.

Furthermore, even if it is possible to optimize the DLL circuit 300 when the LSI circuit operates at a low speed so as to lock the phase, it must take into consideration a frequency range that is not used at the time of normal operations. Therefore, excessive circuits might be made or useless labors might occur.

SUMMARY OF THE INVENTION

It is an object to the present invention to provide a clock signal generating circuit capable of testing a DLL circuit by a method wherein, when an LSI circuit operates at a lower speed for a burn-in test etc., the DLL circuit is performed the same operation as when the LSI circuit normally operates at a high speed. Also, it is a further object of the present invention to provide a semiconductor device that even the DLL circuit is subjected to proper stresS, for example, at the time of a burn-in test, and that the entire LSI circuit can sufficiently be evaluated, by a method wherein, when the LSI circuit operates at a lower speed, a DLL circuit performs the same operation as when the LSI circuit normally operates at a high speed.

These and other objects are achieved in a clock signal generating circuit according to the first embodiment of the present invention that includes a selector for selecting either a reference clock signal or a test clock signal having a different phase with respect to the reference clock signal; and a DLL circuit for giving a delay to an output signal of the selector so as to get rid of a phase difference between the reference clock signal and a clock signal by way of a circuit to be supplied with a clock, and for generating the clock signal to be supplied to the circuit to be supplied with a clock.

Also, these and other objects are achieved in a clock signal generating circuit according to the second embodiment of the present invention that includes:

a first selector for selecting either a first reference clock signal or a first test clock signal having a different phase with respect to the first reference clock signal;

a first DLL circuit for giving a delay to an output signal of the first selector so as to get rid of a phase difference between the first reference clock signal and a first clock signal by way of a circuit to be supplied with a clock, and for generating the first clock signal to be supplied to the circuit to be supplied with a clock;

a second selector for selecting either a second reference clock signal having a different phase from the first reference clock signal or a second test clock signal having a different phase with respect to the second reference clock signal; and a second DLL circuit for giving a delay to an output signal of the second selector so as to get rid of a phase difference between the second reference clock signal and a second clock signal output from a circuit to be supplied with a clock, and for generating the second clock signal to be supplied to the circuit to be supplied with a clock.

These and other objects are achieved in a clock signal generating circuit according to the third embodiment of the present invention that includes an internal circuit for performing a specific operation in synchronism with an internal clock signal; and a clock signal generating circuit for generating the internal clock signal to be supplied to the internal circuit by means of a delay line loop system so as to get rid of a phase difference between a reference clock signal supplied from an external unit and the internal clock signal by way of the internal circuit, the invention including a selector for selecting either the reference clock signal or a test clock signal having a different phase with respect to the reference clock signal to output it; and a delay line loop system phase-locked loop circuit for giving a delay to an output signal of the selector so as to get rid of a phase difference between the reference clock signal and the internal clock signal by way of the internal circuit, and for generating the internal clock signal to be supplied to the internal circuit.

These and other objects are achieved in a clock signal generating circuit according to the fourth embodiment of the present invention that includes first and second internal circuits for respectively performing specific operations in synchronism with first and second internal clock signals; a first clock signal generating circuit for generating the first internal clock signal to be supplied to the first internal circuit by means of a delay line loop system so as to get rid of a phase difference between a first reference clock signal supplied from an external unit and the first internal clock signal by way of the first internal circuit, and a second clock signal generating circuit for generating the second internal clock signal to be supplied to the second internal circuit by means of a delay line loop system so as to get rid of a phase difference between a second reference clock signal having a different phase from the first reference clock signal and the second internal clock signal by way of the second internal circuit, wherein the first clock signal generating circuit includes a first selector for selecting either the first reference clock signal or a first test clock signal having a different phase with respect to the first reference clock signal; and a first delay line loop system phase-locked loop circuit for giving a delay to an output signal of the first selector so as to get rid of a phase difference between the first reference clock signal and the first internal clock signal by way of the first internal circuit, and for generating the first internal clock signal to be supplied to the first internal circuit, and the second clock signal generating circuit includes a second selector for selecting either the second reference clock signal or a second test clock signal having a different phase with respect to the second reference clock signal; and a second delay line loop system phase-locked loop circuit for giving a delay to an output signal of the second selector so as to get rid of a phase difference between the second reference clock signal and the second internal clock signal by way of the second internal circuit, and for generating the second internal clock signal to be supplied to the second internal circuit.

With the above mentioned configuration, when the LSI circuit operates normally at a high speed, the selector selects the reference clock signal. As a result, the reference clock signal is input into the DLL circuit. Then, the DLL circuit gives a delay to the reference clock being an output signal of the selector so as to get rid of a phase difference between the reference clock signal and a clock signal by way of a circuit to be supplied with a clock (internal circuit), and generates the clock signal to be supplied to the circuit to be supplied with a clock.

On the other hand, when the LSI circuit operates at a lower speed for a burn-in test, etc., the selector selects, for example, a test clock signal of which a phase is advanced ahead of the reference clock signal. As a result, the test clock signal is input into the DLL circuit. Thus, the DLL circuit can readily give a delay made within an allowable range to the test clock signal, and the DLL circuit itself performs the same operation as when the LSI circuit operates normally irrespective of a low-speed operation to generate a clock sign .al to be supplied to the circuit to be supplied with a clock.

BRIEF DESCRIPTION OF DRAWINGS

The invention will be described in detail in the following description of preferred embodiments with reference to the following figures wherein:

FIG. 2 is a circuit diagram showing an internal configuration of a phase comparator 2a;

FIG. 5(a) is a waveform diagram showing an operation of the clock signal generating circuit in a normal operation mode as shown in FIG. 1;

FIG. 5(b) is a waveform diagram showing an operation of the clock signal generating circuit in a test operation mode as shown in FIG. 1;

DETAILED DESCRIPTION OF PREFERRED EMBODIMENTS

Figure 1:
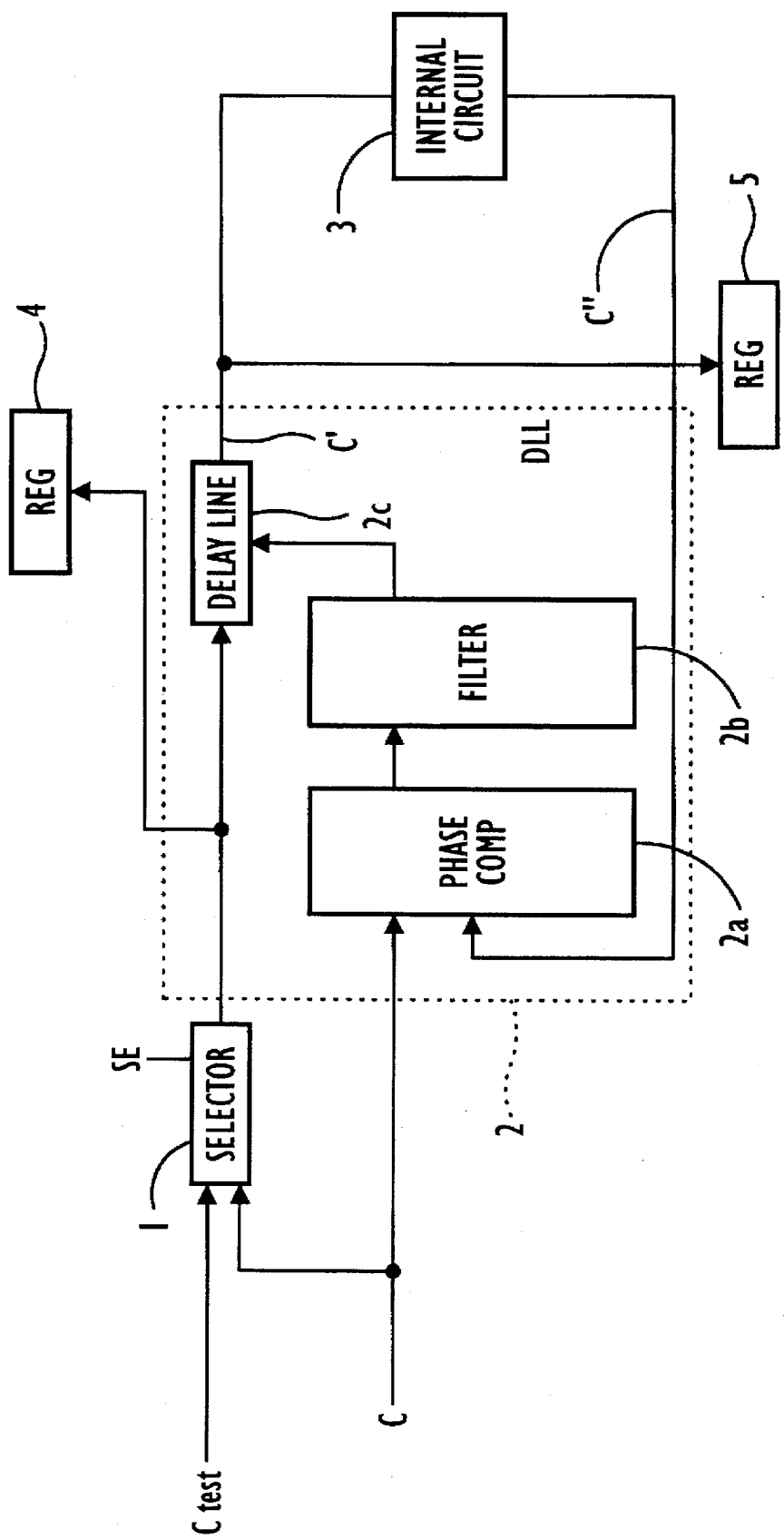
FIG. 1 is a block diagram of a clock signal generating circuit according to one embodiment of the present invention.

Hereinafter, a first embodiment of the present invention will be explained with reference to the accompanying drawings. FIG. 1 is a block diagram showing a clock signal generating circuit according to an embodiment of the present invention.

Figure 16:
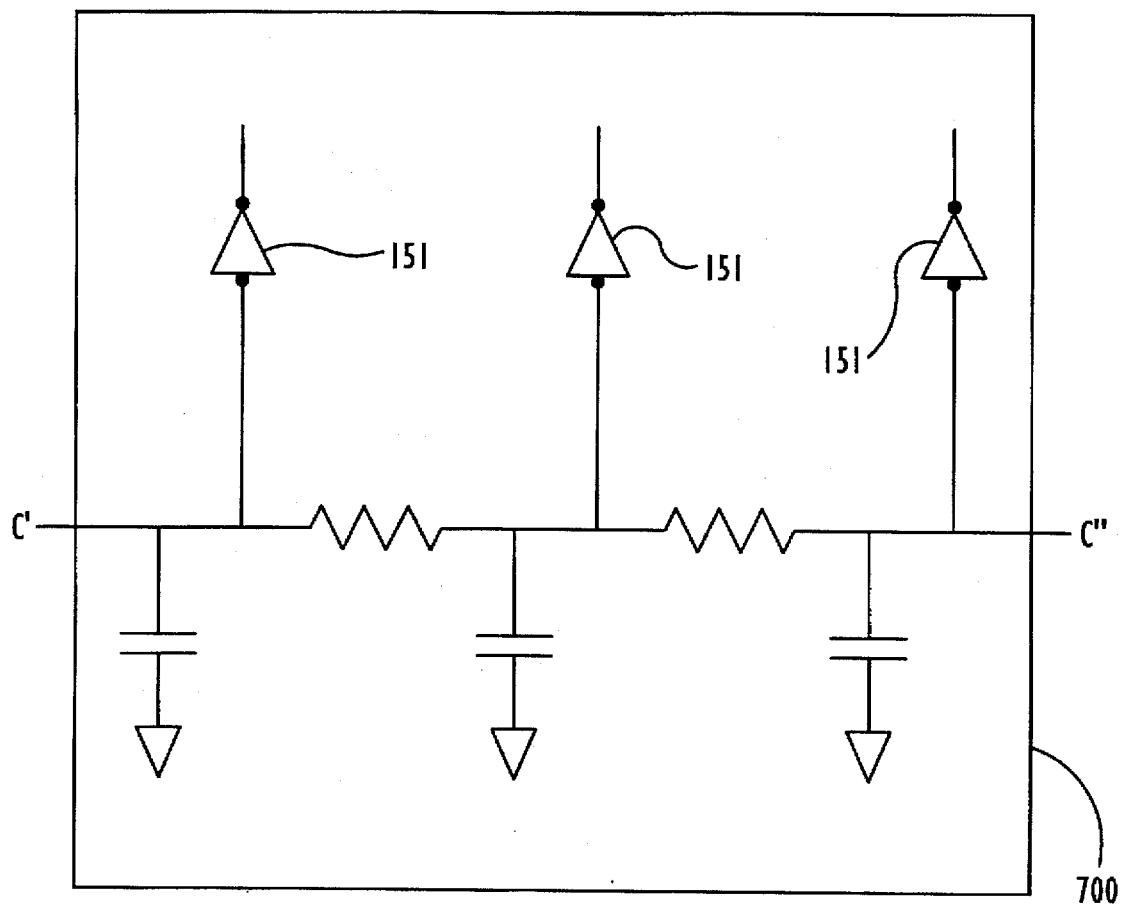
FIG. 16 is a block diagram showing an example of the LSI internal circuit used in FIG. 1, 6, 8, 10, 12 and 14.

This clock signal generating circuit includes a selector 1 for selecting either a reference clock signal C or a test clock signal Ctest, a phase of which is advanced ahead of the reference clock signal C. The clock signal generating circuit further includes a DLL circuit 2 for giving a delay to an output signal of the selector 1 so as to get rid of a phase difference between the reference clock signal C and an internal clock signal C" as propagated througti an LSI internal circuit 3, and for generating the delayed clock signal C' to be supplied to the LSI internal circuit 3. The LSI internal circuit 3 is equivalent to the circuit shown in FIG. 16. This LSI internal circuit outputs internal clock signal C" to the DLL circuit 2.

The DLL circuit 2 includes a phase comparator 2a for detecting a phase difference between the reference clock signal C derived from an external unit and the internal clock signal C" as propagated through the LSI internal circuit 3; a loop filter 2b for changing an output voltage corresponding to a phase difference output of the phase comparator 2a; and a delay line circuit 2c. Delay line circuit 2c provides delayed clock signal C' with a delay with respect to an output signal of the selector 1, an amount of the delay being controlled by an output voltage of the loop filter 2b.

Figure 15:
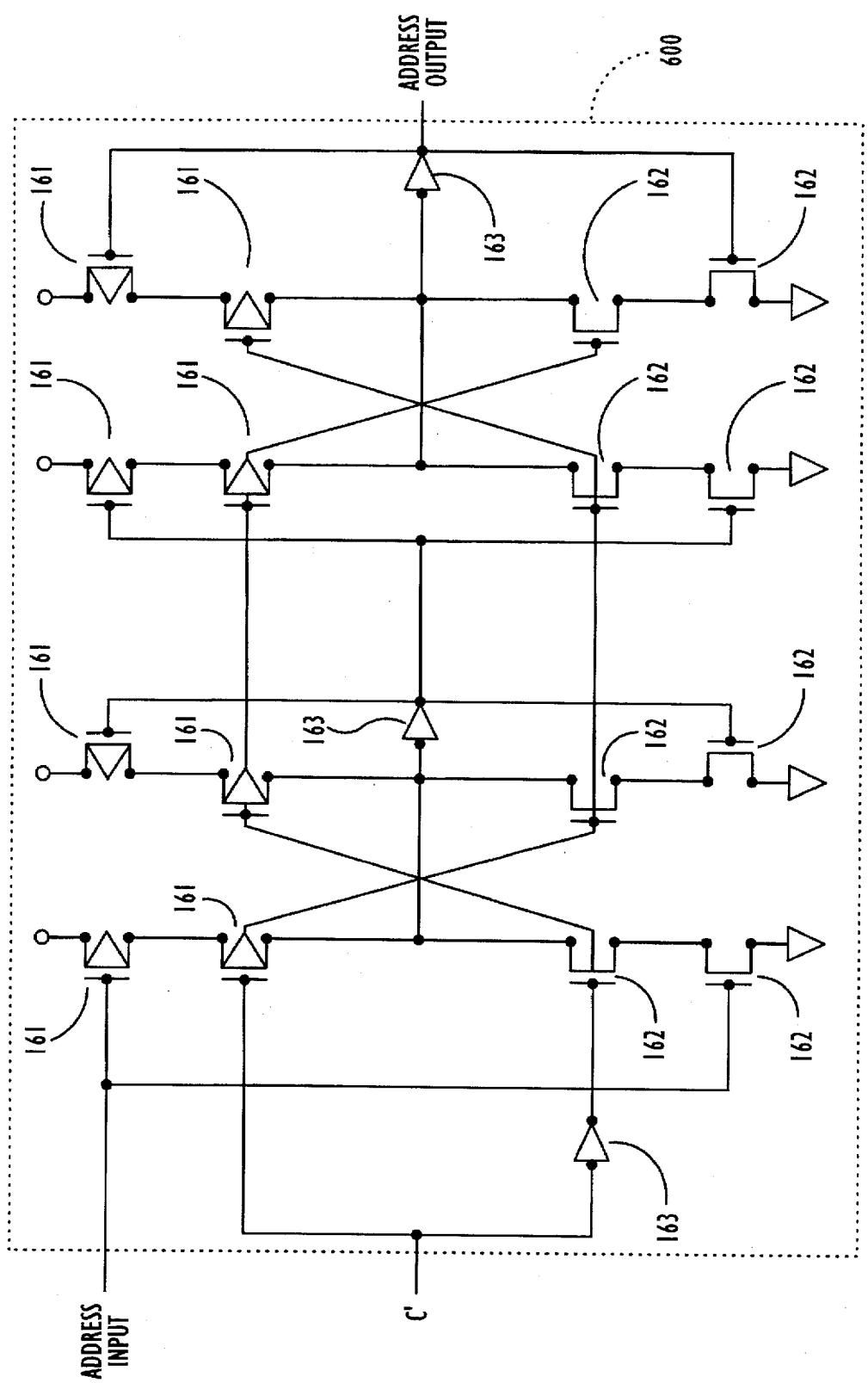
FIG. 15 is a block diagram showing an example of the register used in FIG. 1, 6, 8, 10 and 12.

Furthermore, this embodiment supplies the output signal of the selector 1 to a first register 4 located close to an output side of the selector 1 within an LSI circuit, and supplies the delayed clock signal C', a phase of which is advanced ahead of the output signal of the selector 1, to a second register 5 located far from an output side of the selector 1. These registers are shown in FIG. 15.

Figure 2:
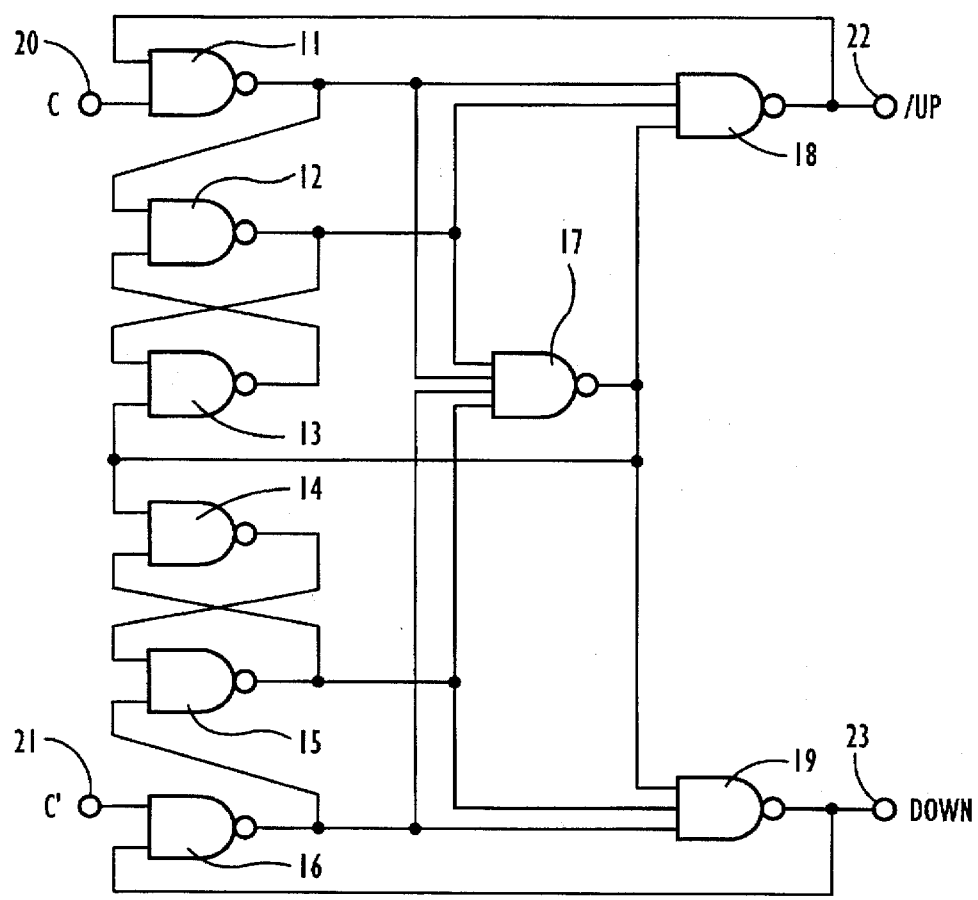

FIG. 2 is a circuit diagram showing an example of an internal configuration of a phase comparator 2a.

Phase comparator 2a includes two-input NAND gates 11 to 16; a four-input NAND gate 17; and three-input NAND gates 18, 19, as shown in FIG. 2. Phase comparator 2a has two input terminals 20, 21 and output terminals 22, 23. The reference clock signal C is input into the input terminal 20 and the internal clock signal C" as propagated through the internal circuit 3 is input into the input terminal 21. An /UP signal is transmitted from the output terminal 22 and a DOWN signal is transmitted from the output terminal 23, respectively.

In the case where a phase of the internal clock signal C" is advanced ahead of the reference clock signal C, the phase comparator 2a activates the DOWN signal, and in the case where a phase of the internal clock signal C" is delayed more than the reference clock signal C, the phase comparator 2a activates the /UP signal. These UP and DOWN signals are output only for a time interval corresponding to each phase difference.

Figure 3:
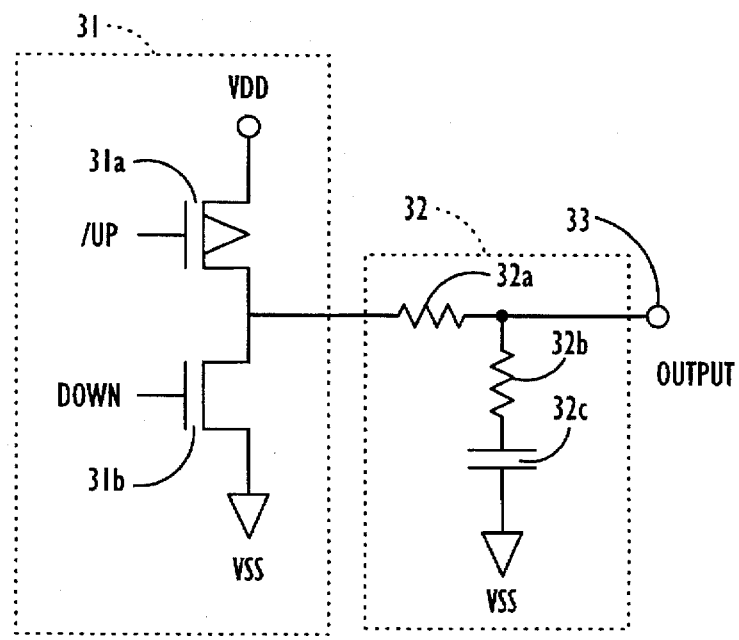
FIG. 3 is a circuit diagram showing an internal configuration of a loop filter 2b.

FIG. 3 is a circuit diagram showing an example of an internal configuration of a loop filter 2b.

Loop filter 2b includes a charge pump part 31 and a lowpass filter 32, as shown in FIG. 3. The charge pump part 31 has a P-MOSFET 31a and an N-MOSFET 31b, and further the lowpass filter 32 has resistance elements 32a, 32b and a capacitor 32c.

When the phase comparator 2a activates the /UP signal, the loop filter 2b turns on the P-MOSFET 31a of the charge pump part 31 and charges the capacitor 32c of the lowpass filter part 32, to raise an electric potential of an output terminal 33. When the phase comparator 2a gives the DOWN signal, the loop filter 2b turns on the N-MOSFET 31b of the charge pump part 31 and discharges the capacitor 32c, to lower an electric potential of the output terminal 33. As described above, the charge pump part 31 converts the /UP and DOWN digital signals which are supplied from the phase comparator 2a into an analog amount, and the lowpass filter part 32 removes high frequency components such as noise etc., and also holds an output electric potential.

Figure 4:
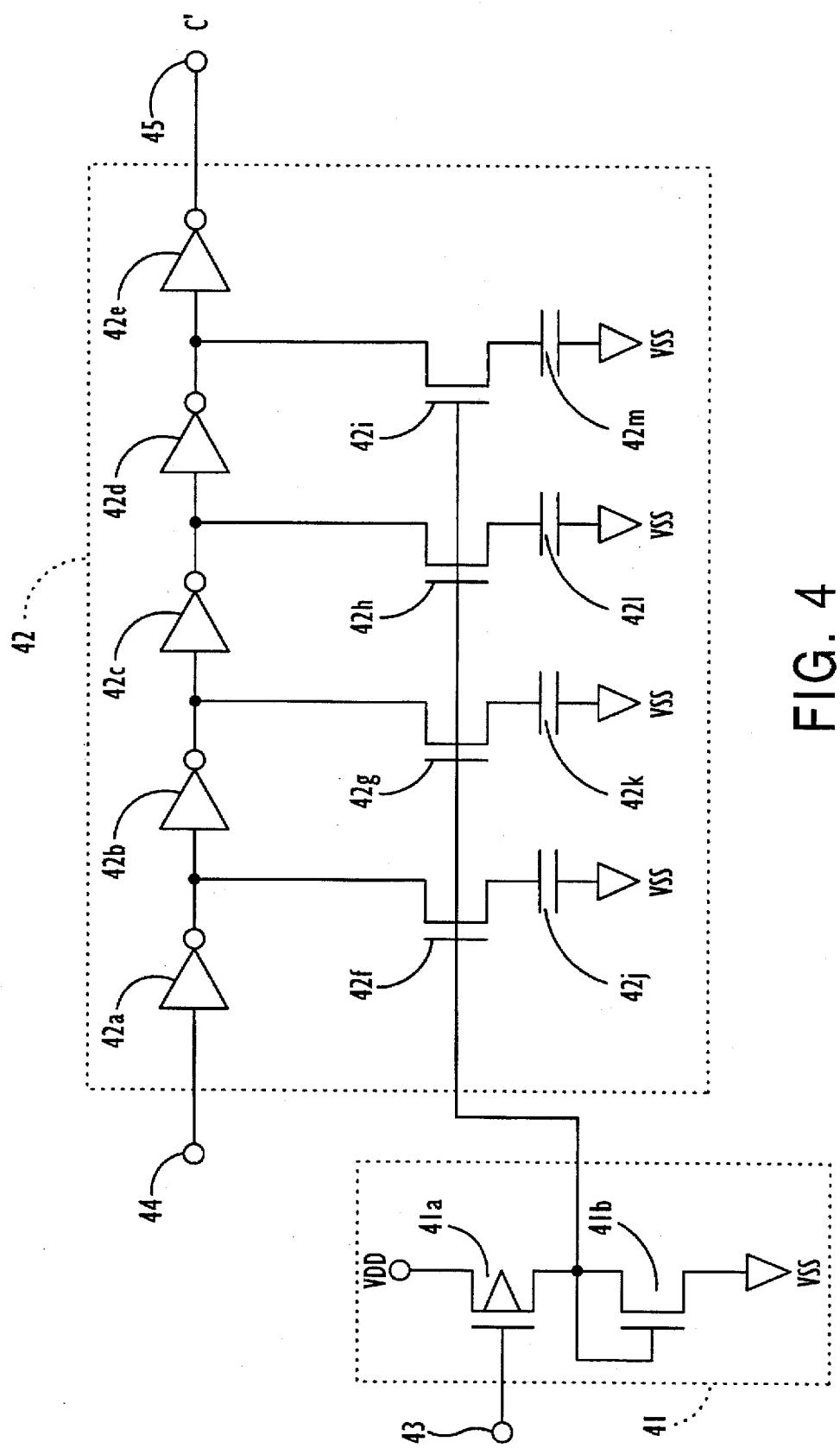
FIG. 4 is a circuit diagram showing an internal configuration of a delay circuit 2c.

FIG. 4 is a circuit diagram showing an example of an internal configuration of a delay line circuit 2c.

As shown in FIG. 4, delay line circuit 2e includes a buffer part 41 halving a P-MOSFET 41a and an N-MOSFET 41b for converting an output electric potential of the loop filter 2b into an opposition phase; and a delay line part 42 having a plurality of inverters 42a to 42e, N-MOSFETs 42f to 42i, and capacitors 42j to 42m. An output of the loop filter 2b is input into an input terminal 43 of the buffer part 41, and an output of the selector 1 is input into an input terminal 44 of the delay line part 42.

In the case where the output electric potential of the loop filter 2b is high, the delay line circuit 2e lowers a gate electric potential of the N-MOSFETs 42f to 42i of the delay line part 42 and reduces a current flowing between a source and a drain of each of the N-MOSFETs 42f to 42i. Therefore, capacitance of the capacitors 42j to 42m on the output side of the inverters 42a to 42e becomes apparently small and a delay of the inverters 42a to 42e becomes small.

Accordingly, a delay of the delay line, that includes the inverters 42a to 42e which are cascade-connected between an input terminal 44 and an output terminal 45, also becomes small.

Conversely, in the case where the output electric potential of the loop filter 2b is low, the delay line circuit 2c enhances the gate electric potential of the N-MOSFETs 42f to 42i and increases a current flowing between a source and a drain of each of the N-MOSFETs 42f to 42i. Therefore, since capacitance of the capacitors 42j to 42m becomes apparently high, a delay through the inverters 42a to 42e of the delay line part 42 increases. Accordingly, a delay of the delay line becomes greater.

As described above, it is possible to change a delay time of the delay line by using the output electric potential of the loop filter 2b.

An operation of the clock signal supply circuit according to this embodiment will be explained.

First, when the LSI circuit operates normally at a high speed, the selector 1 selects the reference clock signal C, and the delayed clock signal C' output from the delay line circuit 2c is made to feedback to the phase comparator 2a through the internal circuit 3. The phase comparator 2a compares the internal clock signal C" with the reference clock signal C to transmit an output (corresponding to the phase difference) to the loop filter 2b. The output of the loop filter 2b controls a delay amount with respect to the reference clock signal C of the delay line circuit 2c. After a specific time interval elapses, the phase difference between the reference clock signal C and the internal clock signal C", which are input into the phase comparator 2a, disappears.

At this time, a phase of the delayed clock signal C' output from the delay line circuit 2c becomes slightly advanced ahead of the reference clock signal C, as shown in FIG. 5(a) as Toffset. In order to generate the delayed clock signal C' having this advanced phase, a delay of about 1 cycle time occurs in the delay line circuit 2c as shown by the arrow in FIG. 5(a).

Reference clock signal C is composed of a continuous sequence of identical reference clock signal segments. Three such segments are depicted in FIG. 5(a). Similarly, the output signal from selector 1 depicted in FIG. 1 (i.e., the selected clock signal) is composed of a continuous sequence of identical selected clock signal segments. Similarly, delayed clock signal C' is composed of a continuous sequence of identical delayed clock signal segments, and internal clock signal C" is composed of a continuous sequence of identical internal clock signal segments. The identical segments that are combined to form a clock signal (e.g., a reference clock signal, a selected clock signal, a delayed clock signal or an internal clock signal) are characterized by a segment duration (i.e., a clock period). In FIG. 1, delay line circuit 2c functions to delay the selected clock signal (i.e., the output of selector 1) by a controllable delay, and then delay line circuit 2c outputs delayed clock signal C'. The controllable delay is variable about an integer multiple of a segment duration (e.g., variable about 1, 2 or more segment durations). For example, the delay may be controlled to be exactly one segment duration. In such a circumstance, a first selected clock signal segment enters delay line circuit 2c and is delayed by a segment duration to when it is provided at an output as a corresponding delayed clock signal segment. The delayed clock signal segment at the output of delay line circuit 2c is the delayed result of a prior selected clock signal segment; however, it is provided at the output of delay line circuit 2c at a time when a subsequent selected clock signal segment is provided at the output of selector 1. The delayed clock signal segment appears to be an exact copy of the subsequent selected clock signal segment even though it is the delayed result of a prior selected clock signal segment.

In FIG. 1, delayed clock signal C' is further delayed while propagating through internal circuit 3 to form internal clock signal C". An internal clock signal segment may appear to be coincident with a subsequent selected clock signal segment, but is a twice delayed result of a prior selected clock signal segment. Phase comparator 2a compares an internal clock signal segment with a subsequent selected clock signal segment. Delay line loop phase-locked loop circuit 2 operates so as to control the controllable delay of delay line circuit 2c so that a phase difference between the subsequent selected clock signal segment and an internal clock signal segment of the internal clock signal that corresponds to the prior selected clock signal segment is substantially eliminated.

The reference clock signal C is supplied to the register 4 located close to the output side of the selector 1, as described above, and the internal clock signal C', of which a phase advances ahead of the reference clock signal C, is supplied to the register 5 located far from the output side of the selector 1. Therefore, a clock skew is decreased.

When the LSI circuit operates at a low speed (e.g., for a burn-in test, etc.), the selector 1 selects the test clock signal Ctest, a phase of which is advanced ahead of the reference clock signal C. Then, the DLL circuit 2 performs the same operation with the use of this test clock signal Ctest as when the LSI circuit operates normally at a high speed, as described above. The delayed clock signal C' output from the delay line circuit 2c is made a feedback to the phase comparator 2a as the internal clock signal C" through the internal circuit 3, and the phase comparator 2a phase-compares the internal clock signal C" with the reference clock signal C. Then, an output corresponding to the phase difference is transmitted to the loop filter 2b and the output transmitted to the loop filter 2b moderates a delay amount with respect to the test clock signal Ctest of the delay line circuit 2c. After a specific time interval elapses, the phase difference between the reference clock signal C and the internal clock signal C" input into the phase comparator 2c disappears.

As described above, the delay line circuit 2c generates the delayed clock signal C', a phase of which is advanced ahead of the reference clock signal C. Therefore, it is necessary to generate a delay of about 1 cycle time in the delay line circuit 2c. If the reference clock signal C would be supplied to the delay line circuit 2c as in the conventional art, a delay necessary for the delay line circuit 2c would exceed a delay amount that can be generated in the delay line circuit 2c, as shown by an arrow P1 of FIG. 5(b), and, therefore, the DLL circuit 2 could not operate normally. The LSI circuit operates at a lower speed (e.g., for a burn-in test, etc.), the test clock signal Ctest, a phase of which is advanced ahead of the reference clock signal C by means of the selector 1, is supplied to the delay line circuit 2c, as in this embodiment. Thus, as shown by an arrow P2 of FIG. 5(b), the delayed clock signal C' can readily be generated with a delay amount within an allowable range of the delay line circuit 2c, and even when the LSI circuit operates at a lower speed, the DLL circuit 2 can operate normally. Furthermore, since the DLL is subjected to stress in a burn-in test, the entire LSI circuit containing the DLL circuit can be sufficiently evaluated.

Figure 6:
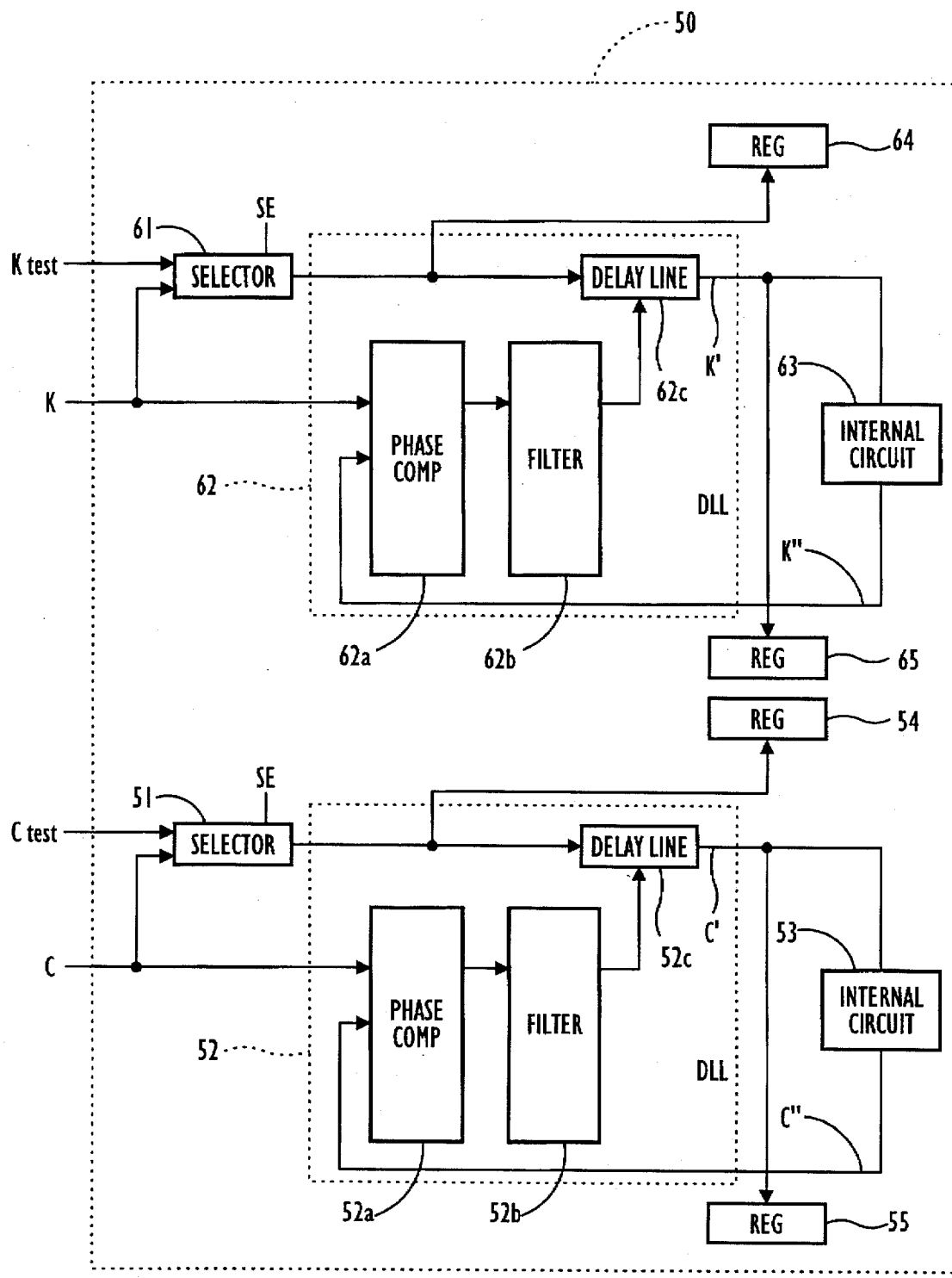
FIG. 6 is a diagram showing an embodiment to which a clock signal generating circuit of the present invention is applied in a two-phase clock system semiconductor device.

FIG. 6 is a diagram showing a second embodiment of the clock signal generating circuit according to the present invention as applied to a two-phase clock system semiconductor device.

Figure 12:
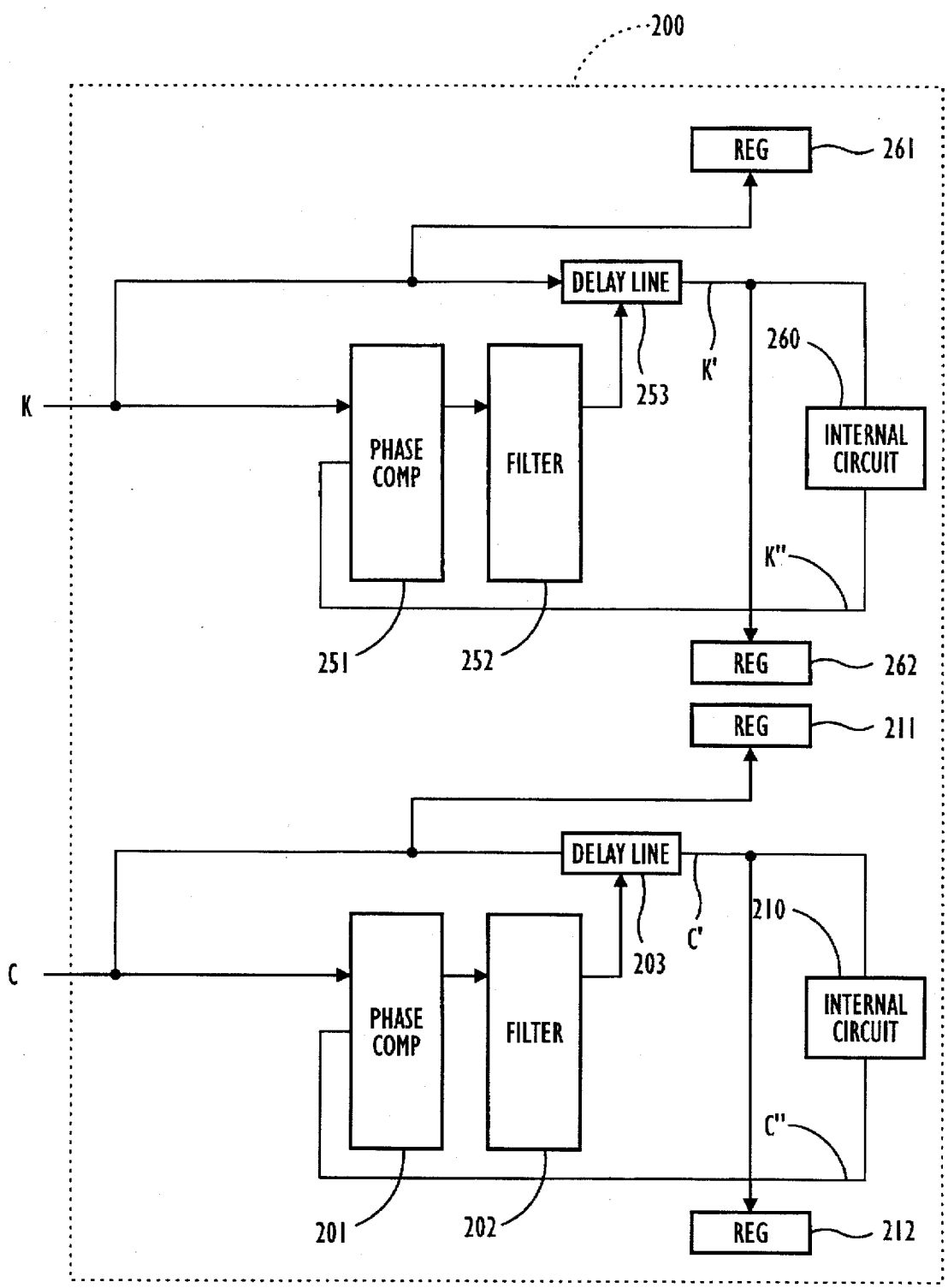
FIG. 12 is a diagram showing the conventional clock signal generate circuit is applied in a two-phase clock system semiconductor device.
Figure 13:
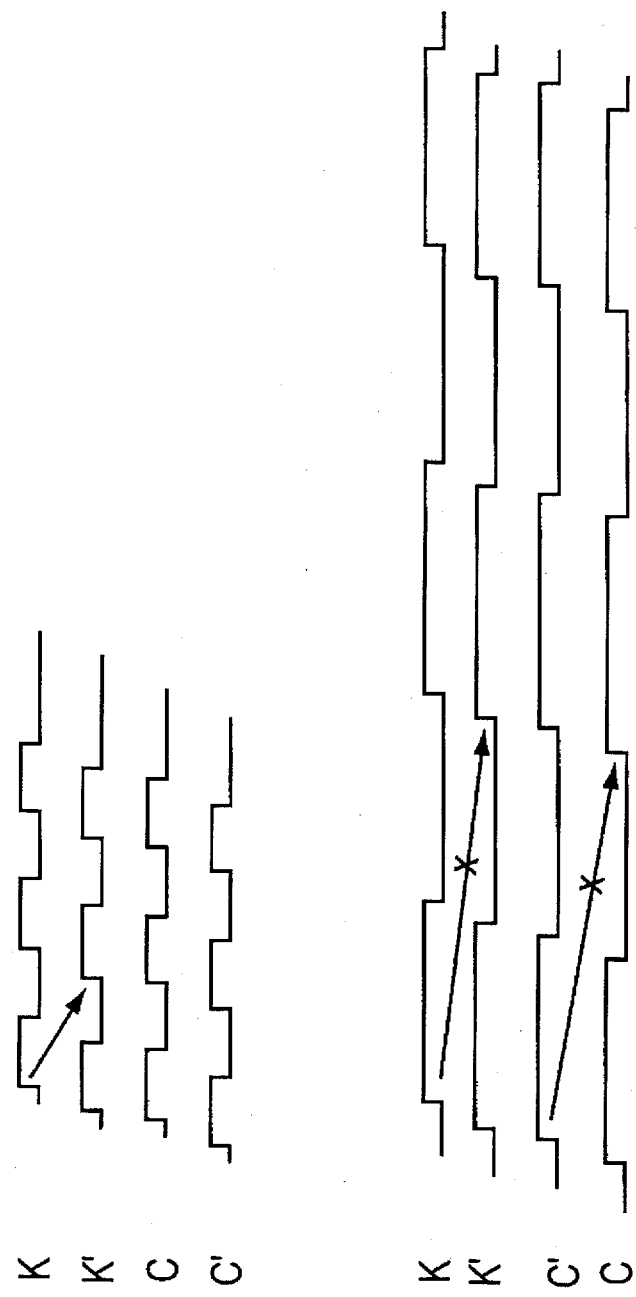
FIG. 13(a) is a waveform diagram showing an operation of the clock signal generating circuit in a normal operation mode as shown in FIG. 12.
FIG. 13(b) is a waveform diagram showing an operation of the clock signal generating circuit in a test operation mode as shown in FIG. 12.
Figure 14:
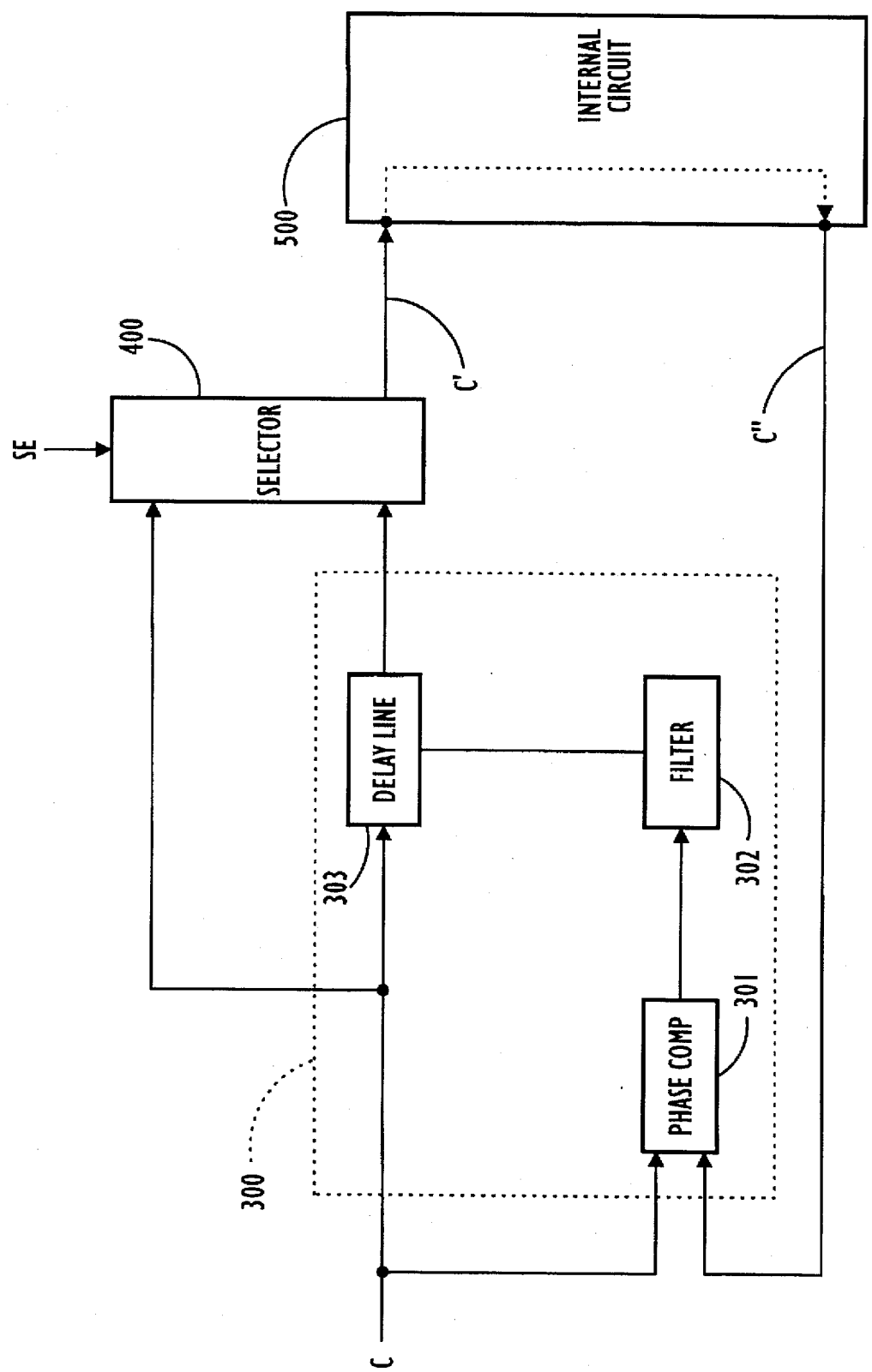
FIG. 14 is a block diagram showing another conventional clock signal generating circuit for use in a DLL circuit.

The two-phase clock system semiconductor device according to this embodiment improves upon the conventional embodiment of FIG. 12. For example, in a synchronous RAM, the two phases of a reference clock signal K (for the input side) and the reference clock signal C (for the output side), a phase of which is advanced ahead of the reference clock signal K, are used as a reference clock.

With the configuration of this embodiment, two clock signal generating circuits having the same function, as shown in FIG. 1 as described above, are provided within a semiconductor device 50, and a first reference clock signal C and a first test clock signal Ctest, a phase of which is advanced ahead of reference clock signal C, are supplied from an external unit to the one clock signal generating circuit, and a second reference clock signal K and a second test clock signal Ktest, a phase of which is advanced ahead of reference clock signal K, are supplied from an external unit to the other clock signal generating circuit.

The clock signal generating circuit supplied with the first reference clock signal C and the first test clock signal Ctest includes a selector 51 and a DLL circuit 52 having a phase comparator 52a, a loop filter 52b, and a delay line circuit 52c in order to generate the delayed clock signal C' supplied to the LSI internal circuit 53 by the same operation as the first embodiment. Further, the clock signal generating circuit supplied with the second reference clock signal K and the second test clock signal Ktest includes a selector 61 and a DLL circuit 62 having a phase comparator 62a, a loop filter 62b, and a delay line circuit 62c in order to similarly generate the delayed clock signal K' to be supplied to an LSI internal circuit 63.

An output register 54 and an input register 64 correspond to the register 4, as shown in FIG. 1 as described above, and an output register 55 and an input register 65 similarly correspond to the register 5 of FIG. 1.

Figure 7:
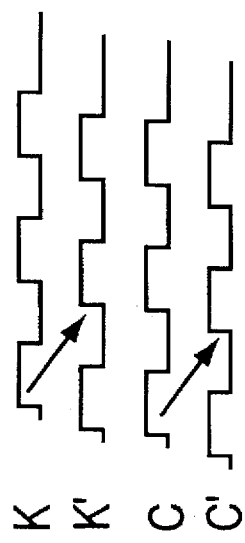
FIG. 7(a) is a waveform diagram showing an operation of the clock signal generating circuit in a normal operation mode as shown in FIG. 6.
FIG. 7(b) is a waveform diagram showing an operation of the clock signal generating circuit in a test operation mode as shown in FIG. 6.
Figure 7:
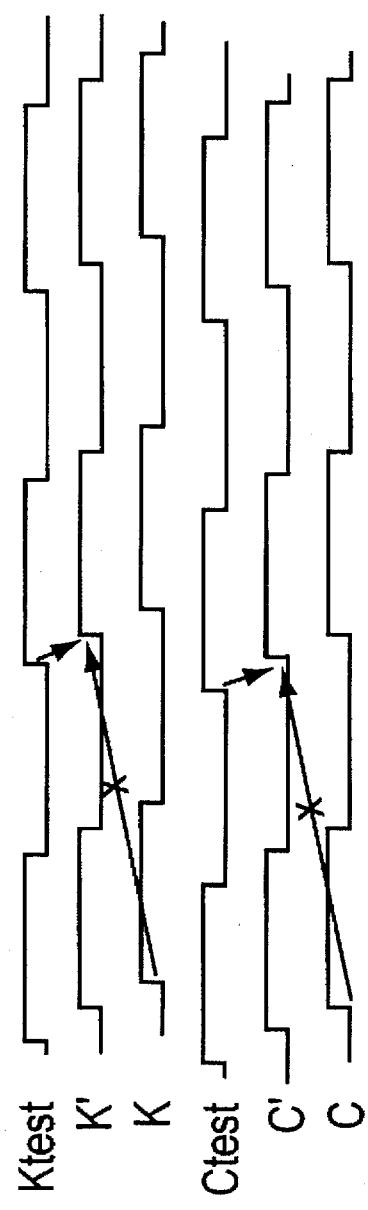

According to this second embodiment, when the LSI circuit operates normally, the selectors 51, 61 select the reference clock signals C, K, respectively, and then the operations of the DLL circuits 52, 62 are the same as the above-mentioned signal phase (FIG. 7(a)). On the other hand, when the LSI circuit operates at a lower speed, and in the case where the selectors 51, 61 would select the reference clock signals C, K in the same manner as the conventional embodiment, a delay would exceed an allowable value of the delay line circuits 52c, 62c. Therefore, the selectors 51, 61 select the first test clock signal Ctest and the second test clock signal Ktest, phases of which are advanced ahead of the reference clock signals C, K, respectively. As shown in FIG. 7(b), the delayed clock signals C', K' can be generated within an allowable range of a delay that can be generated in the delay line circuits 52c, 62c and in the LSI internal circuit 63, whereby the second embodiment can obtain the similar advantages as the first embodiment.

Figure 8:
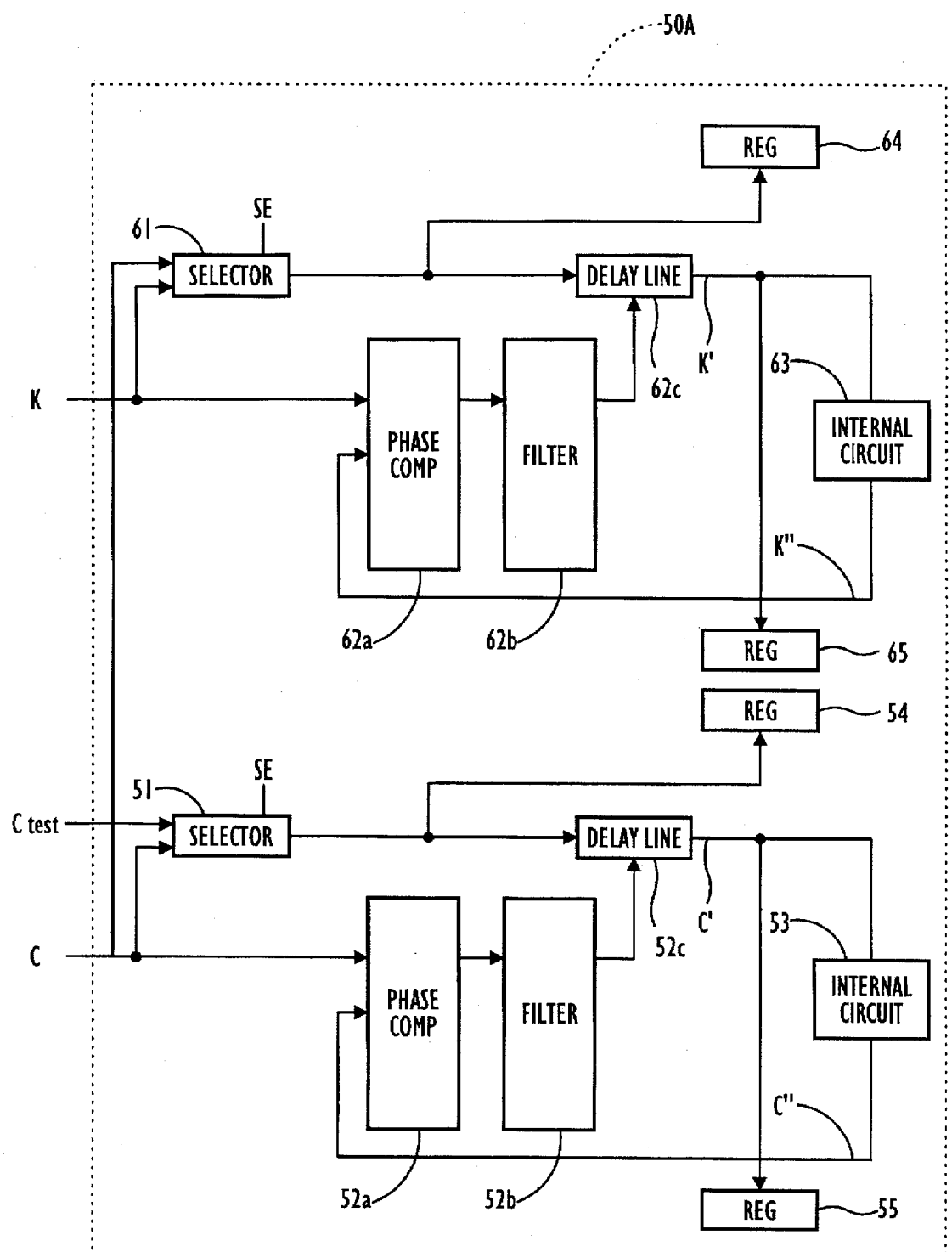
FIG. 8 is a diagram showing another embodiment to which a clock signal generating circuit of the present invention is applied in a two-phase clock system semiconductor device.

FIG. 8 is a diagram showing a third embodiment to which a clock signal generating circuit of the present invention is applied to a two-phase clock system semiconductor device, and the same identification numerals are assigned to like elements in common with FIG. 6.

According to the third embodiment, a first reference clock signal C, a phase of which is advanced ahead of a second reference clock signal K, is applied to both clock signal generating circuits of device 50A. Taking advantage of the first reference clock signal C when the LSI circuit operates at a lower speed, the first reference clock signal C is supplied through selector 61 to a delay line 62c instead of a second test clock signal Ktest.

Figure 9:
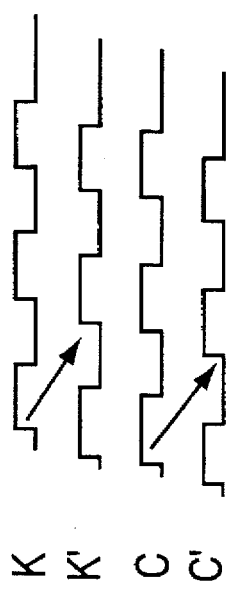
FIG. 9(a) is a waveform diagram showing an operation of the clock signal generating circuit in a normal operation mode as shown in FIG. 8.
FIG. 9(b) is waveform diagram showing an operation of the clock signal generating circuit in a test operation mode as shown in FIG. 8.
Figure 9:
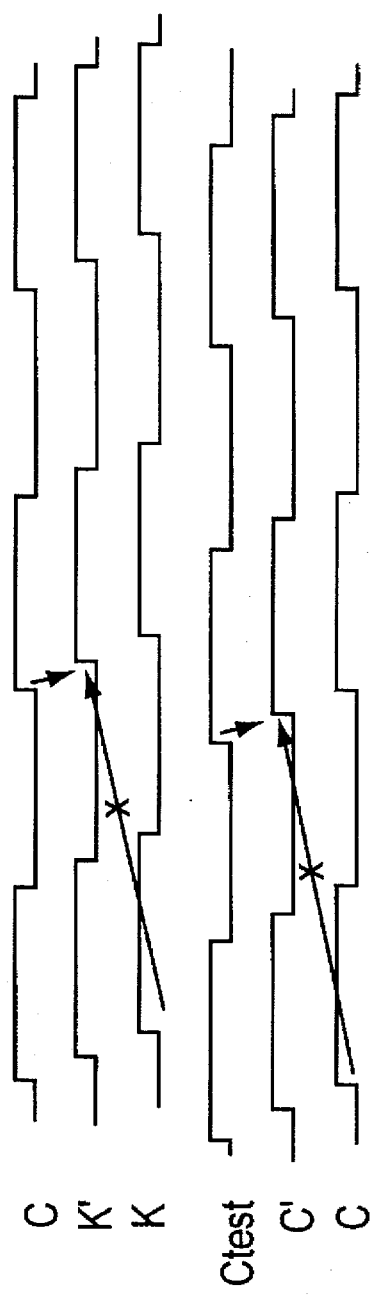
Figure 10:
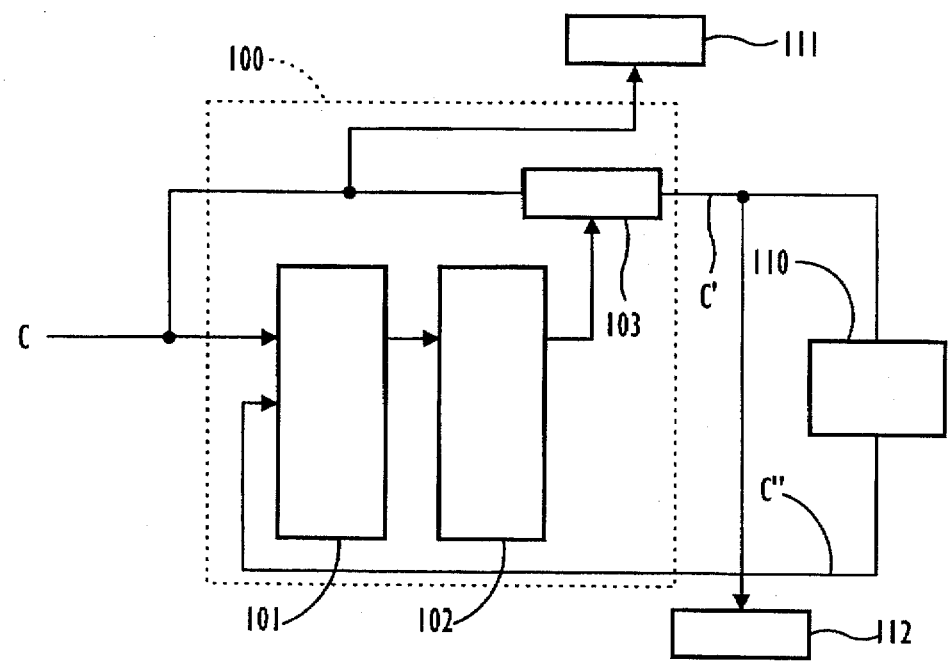
FIG. 10 is a block diagram showing a conventional clock signal generating circuit for use in a DLL circuit.
Figure 11:
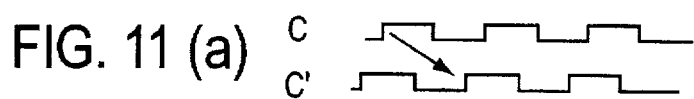
FIG. 11(a) is a waveform diagram showing an operation of the clock signal generating circuit in a normal operation mode as shown in FIG. 10.
FIG. 11(b) is a waveform diagram showing an operation of the clock signal generating circuit in a test operation mode as shown in FIG. 10.
Figure 11:
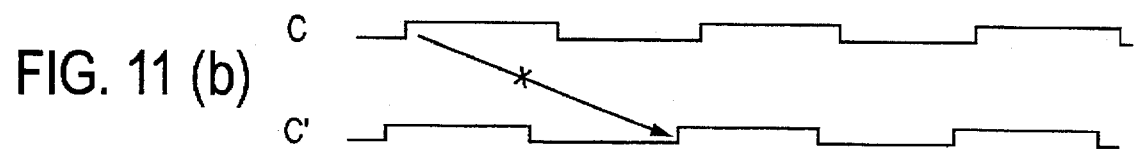

With such configuration, even when the LSI circuit operates normally, as depicted in FIG. 9(a), or when the LSI circuit operates at a lower speed, as depicted FIG. 9(b), the LSI circuit operates in the same manner as the above-mentioned second embodiment, as shown in FIG. 6. Since the second test clock signal Ktest is not required to be supplied from an external unit, when the LSI circuit operates at a lower speed, a test can more readily be performed.

According to the above-detailed explanation, the clock signal generating circuit of the present invention is achieved by adding simple circuits to the conventional clock signal generating circuit without requiring an additional DLL circuit. Even when the LSI circuit operates at a lower speed, the DLL circuit can operate in the same manner as when the LSI circuit operates normally at a high speed. Therefore, even when the LSI circuit must be tested at a low clock frequency due to unavailability of high-speed testers, the DLL circuit can be tested.

Having described preferred embodiments of a novel semiconductor clock signal generation circuit (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. In an integrated circuit with an internal circuit, a clock signal generating circuit comprising:

a selector for providing a selected clock signal by selecting one of a reference clock signal and a test clock signal, the selected clock signal comprising a sequence of selected signal segments; and a delay line loop phase-locked loop circuit coupled to the selected clock signal and the reference clock signal for providing a delayed clock signal, the delayed clock signal being delayed with respect to the selected clock signal by a controllable delay, the delayed clock signal propagating through the internal circuit to become an internal clock signal, the internal clock signal being coupled to an input of the delay line loop phase-locked loop circuit, the internal clock signal comprising a sequence of internal signal segments, each internal signal segment corresponding to a respective selected signal segment, the selected signal segments of the selected clock signal including a prior selected signal segment and a subsequent selected signal segment, the delay line loop phase-locked loop circuit operating so as to control the controllable delay so that a phase difference between the subsequent selected signal segment and an internal signal segment of the internal clock signal that corresponds to the prior selected signal segment is substantially eliminated.

2. In an integrated circuit with first and second internal circuits, a multi-phase clock signal generating circuit comprising:

a first selector for providing a first selected clock signal by selecting one of a first reference clock signal and a first test clock signal, the first selected clock signal comprising a sequence of first selected signal segments;

a first delay line loop phase-locked loop circuit coupled to the first selected clock signal and the first reference clock signal for providing a first delayed clock signal, the first delayed clock signal being delayed with respect to the first selected clock signal by a first controllable delay, the first delayed clock signal propagating through the first internal circuit to become a first internal clock signal, the first internal clock signal being coupled to an input of the first delay line loop phase-locked loop circuit, the first internal clock signal comprising a sequence of first internal signal segments, each first internal signal segment corresponding to a respective first selected signal segment, the first selected signal segments of the first selected clock signal including a fn:st prior selected signal segment and a first subsequent selected signal segment, the first delay line loop phase-locked loop circuit operating so as to control the first controllable delay so that a first phase difference between the first subsequent selected signal segment and a first internal signal segment of the first internal clock signal that corresponds to the first prior selected signal segment is substantially eliminated;

a second selector for providing a second selected clock signal by selecting one of a second reference clock signal and a second test clock signal, the second selected clock signal comprising a sequence of second selected signal segments; and a second delay line loop phase-locked loop circuit coupled to the second selected clock signal and the second reference clock signal for providing a second delayed clock signal, the second delayed clock signill being delayed with respect to the second selected clock signal by a second controllable delay, the second delayed clock signal propagating through the second internal circuit to become a second internal clock signal, the second internal clock signal being coupled to an input of the second delay line loop phase-locked loop circuit, the second internal clock signal comprising a sequence of second internal signal segments, each second internal signal segment corresponding to a respective second selected signal segment, the second selected signal segments of the second selected clock signal including a second prior selected signal segment and a second subsequent selected signal segment, the second delay line loop phase-locked loop circuit operating so as to control the second controllable delay so that a second phase difference between the second subsequent selected signal segment and a second internal signal segment of the second internal clock signal that corresponds to the second prior selected signal segment is substantially eliminated.

3. A signal generate circuit as claimed in claim 2, wherein the first reference clock signal is supplied as the second test clock signal.

4. In an integrated circuit with an internal circuit, a clock signal generate circuit comprising:

a selector for providing a selected clock signal by selecting one of a reference clock signal and a test clock signal; and a delay line loop phase-locked loop circuit coupled to the selected clock signal and the reference clock signal for providing a delayed clock signal, the delay line loop phase-locked loop circuit including a controllable delay line through which the selected clock signal propagates to become the delayed clock signal, the delayed clock signal propagating through the internal circuit to become an internal clock signal, the delay line loop phase-locked loop circuit further including a loop filter, the delay line loop phase-locked loop circuit further including a phase comparator coupled to the reference clock signal and the internal clock signal for providing a comparison signal, the comparison signal propagating through the loop filter to become a delay control signal coupled to the controllable delay line.

5. In an integrated circuit with first and second internal circuits, a multi-phase clock signal generating circuit comprising:

a first selector for providing a first selected clock signal by selecting one of a first reference clock signal and a first test clock signal;

a first delay line loop phase-locked loop circuit coupled to the first selected clock signal and the first reference clock signal for providing a first delayed clock signal, the first delay line loop phase-locked loop circuit including a first controllable delay line through which the first selected clock signal propagates to become the first delayed clock signal, the first delayed clock signal propagating through the first internal circuit to become a first internal clock signal, the first delay line loop phase-locked loop circuit further including a first loop filter, the first delay line loop phase-locked loop circuit further including a first phase comparator coupled to the first reference clock signal and the first internal clock signal for providing a first comparison signal, the first comparison signal propagating through the first loop filter to become a first delay control signal coupled to the first controllable delay line;

a second selector for providing a second selected clock signal by selecting one of a second reference clock signal and a second test clock signal; and a second delay line loop phase-locked loop circuit coupled to the second selected clock signal and the second reference clock signal for providing a second delayed clock signal, the second delay line loop phase-locked loop circuit including a second controllable delay line through which the second selected clock signal propagates to become the second delayed clock signal, the second delayed clock signal propagating through the second internal circuit to become a second internal clock signal, the second delay line loop phase-locked loop circuit further including a second loop filter, the second delay line loop phase-locked loop circuit further including a second phase comparator coupled to the second reference clock signal and the second internal clock signal for providing a second comparison signal, the second comparison signal propagating through the second loop filter to become a second delay control signal coupled to the second controllable delay line.

6. A signal generate circuit as claimed in claim 5, wherein the first reference clock signal is supplied as the second test clock signal.

7. A semiconductor device comprising:

an internal circuit for performing a specific operation in synchronism with an internal clock signal; and a clock signal generating circuit, wherein the clock signal generating circuit includes a selector for providing a selected clock signal by selecting one of a reference clock signal and a test clock signal, and wherein the clock signal generating circuit further includes a delay line loop phase-locked loop circuit coupled to the selected clock signal and the reference clock signal for providing a delayed clock signal, the delayed clock signal being coupled to an input of the internal circuit, the internal circuit providing the internal clock signal at an output of the internal circuit, the delay line loop phase-locked loop circuit adjusting a phase of the delayed clock signal with respect to the selected clock signal so that the internal clock signal is phase locked with the selected clock signal.

8. A semiconductor device comprising:

first and second internal circuits for respectively performing specific operations in synchronism with respective first and second internal clock signals; and first and second clock signal generating circuits, wherein the first clock signal generating circuit includes a first selector for providing a first selected clock signal by selecting one of a first reference clock signal and a first test clock signal, wherein the first clock signal generating generating circuit further includes a first delay line loop phase-locked loop circuit coupled to the first selected clock signal and the first reference clock signal for providing a first delayed clock signal, the first delayed clock signal being coupled to an input of the first internal circuit, the first internal circuit providing the first internal clock signal at an output of the first internal circuit, the first delay line loop phase-locked loop circuit adjusting a first phase of the first delayed clock signal with respect to the first selected clock signal so that the first internal clock signal is phase locked with the first selected clock signal, wherein the second clock signal generating circuit includes a second selector for providing a second selected clock signal by selecting one of a second reference clock signal and a second test clock signal, and wherein the second clock signal generating circuit further includes a second delay line loop phase-locked loop circuit coupled to the second selected clock signal and the second reference clock signal for providing a second delayed clock signal, the second delayed clock signal being coupled to an input of the second internal circuit, the second internal circuit providing the second internal clock signal at an output of the second internal circuit, the second delay line loop phase-locked loop circuit adjusting a second phase of the second delayed clock signal with respect to the second selected clock signal so that the second internal clock signal is phase locked with the second selected clock signal.

9. A semiconductor device as claimed in claim 8, wherein the first reference clock signal is supplied as the second test clock signal.

* * * * *